United States Patent [19]

Okada et al.

[11] Patent Number: 5,227,626
[45] Date of Patent: Jul. 13, 1993

[54] LITHOGRAPHY APPARATUS USING SCANNING TUNNELING MICROSCOPY

[75] Inventors: Takao Okada; Hiroshi Kajimura, both of Tokyo, Japan

[73] Assignee: Olympus Optical Co., Ltd., Tokyo, Japan

[21] Appl. No.: 828,349

[22] Filed: Jan. 30, 1992

[30] Foreign Application Priority Data

Feb. 6, 1991 [JP] Japan .................................. 3-035090

[51] Int. Cl.$^5$ ................................................ H01J 3/14
[52] U.S. Cl. .................................. 250/234; 250/492.2; 250/307
[58] Field of Search .................... 250/292.2, 292.3, 548, 250/557, 234, 216, 306, 307; 156/643; 356/399, 400, 401

[56] References Cited

U.S. PATENT DOCUMENTS

| | | | |
|---|---|---|---|
| 4,677,301 | 6/1987 | Tanimoto et al. ................... | 250/548 |
| 5,015,323 | 5/1991 | Gallagher .......................... | 250/492.3 |
| 5,043,578 | 8/1991 | Güethner et al. ................. | 250/492.2 |
| 5,047,649 | 9/1991 | Hodgson et al. .................. | 250/492.2 |

FOREIGN PATENT DOCUMENTS

3915642A1 12/1989 Fed. Rep. of Germany .

OTHER PUBLICATIONS

Article entitled Nanostructure Fabrication by Scanning Tunneling Microscope by Masakazu Baba et al., Published in Journal of Applied Physics, vol. 29, No. 12, Dec. 1990, pp. 2854–2857.
Article entitled Direct Writing with the Scanning Tunneling Microscope by E. E. Ehrichs, et al., Published in J. Vac. Sci. Technol. A6 (2), Mar./Apr. 1988, pp. 540–543.
Article entitled Nanometer-Scale Wafer Alignment For Lithography Using Tunneling, Published in IBM Technical Disclosure Bulletin, vol. 33, No. 2, Jul. 1990, pp. 260–261.
Article entitled Applications of Scanning Probe Microscopy in the Semiconductor Industry, by I. Smith, et al., Published in Solid State Technology, Dec. 1990, pp. 53–56.
IBM Journal of Research and Development, vol. 32, No. 4, Jul. 1988, pp. 462–493.
Nanotechnology 1 (1990), "The Scanning Tunneling Microscope As A Tool For Nanofabrication", pp. 67–80.

*Primary Examiner*—David C. Nelms
*Assistant Examiner*—K. Shami
*Attorney, Agent, or Firm*—Frishauf, Holtz, Goodman & Woodward

[57] ABSTRACT

A lithography apparatus is provided with an SXM base, which has a plurality of cantilevers movably supporting probes at their free ends, respectively. The SXM base is secured to a mirror base by a support arm via inchworm devices, such that it faces a silicon wafer placed on a wafer stage. The silicon wafer has an alignment pattern formed thereon, while the SXM base has a reference alignment pattern formed thereon which is similar to the alignment pattern. A voltage is applied to the probes at a predetermined point of time under the control of a controller while a gas containing a film-forming material is being supplied onto the wafer, whereby the film-forming material is adsorbed in a desired portion of the surface of the wafer.

16 Claims, 7 Drawing Sheets

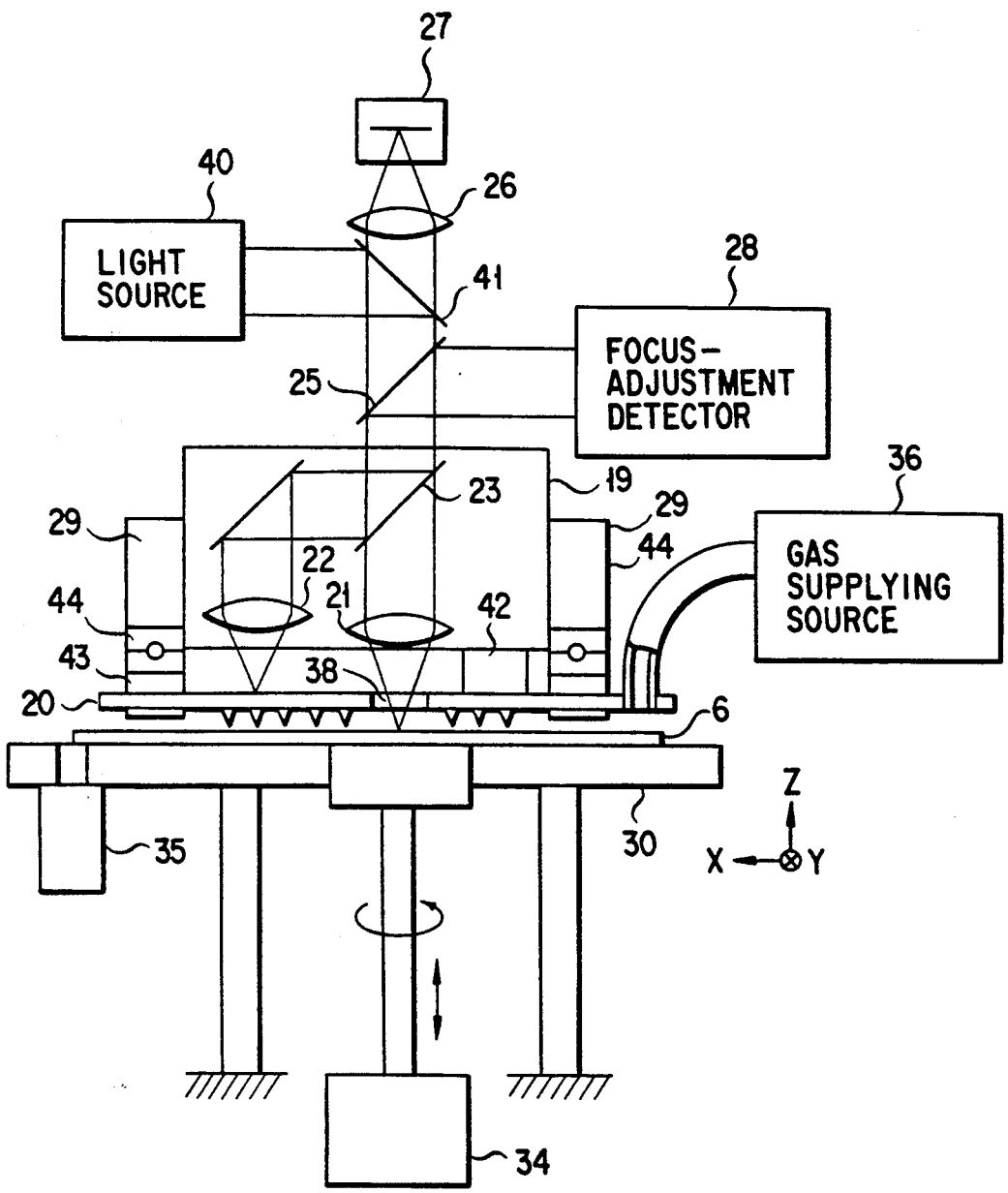
F I G. 1

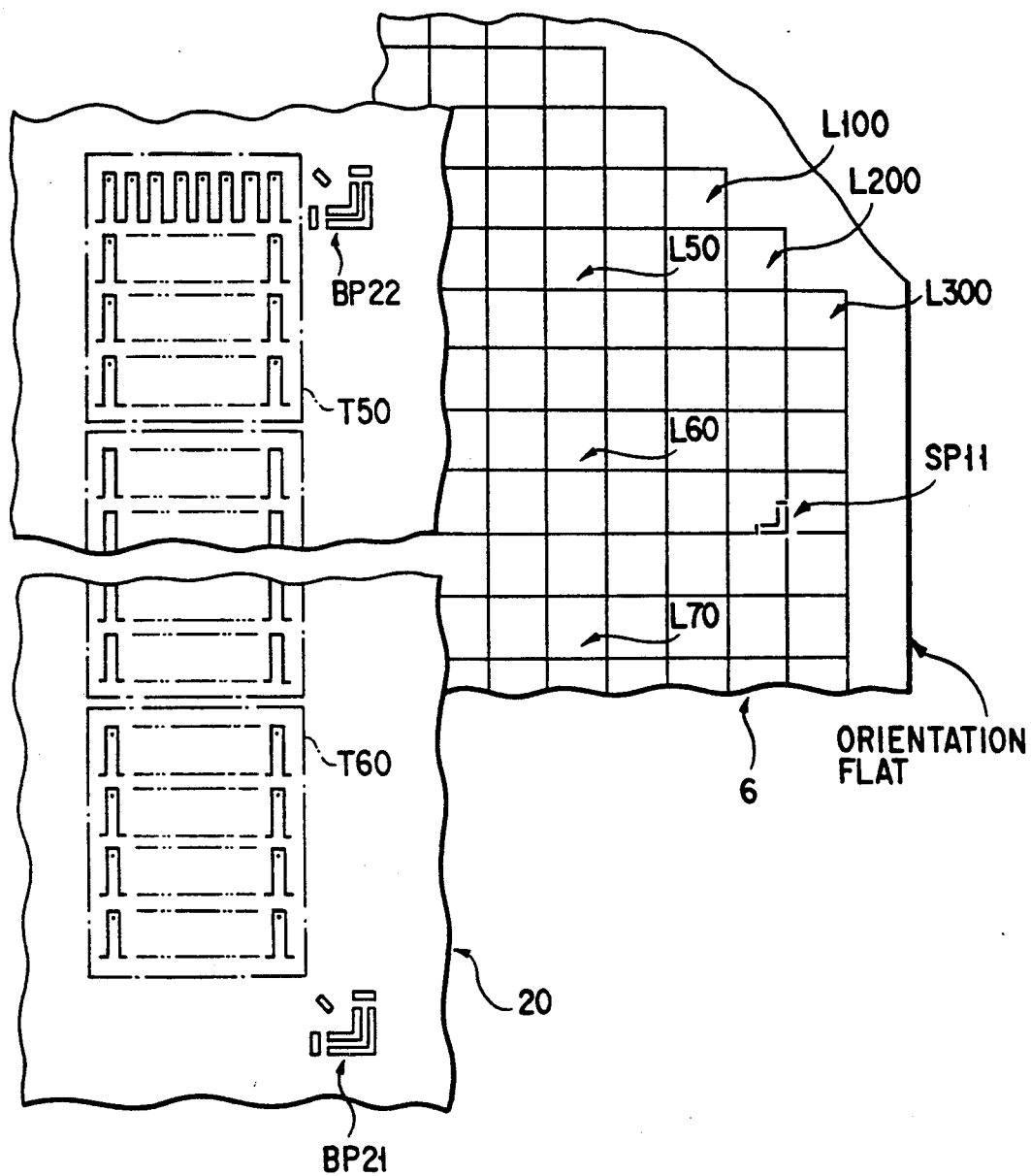
F I G. 2

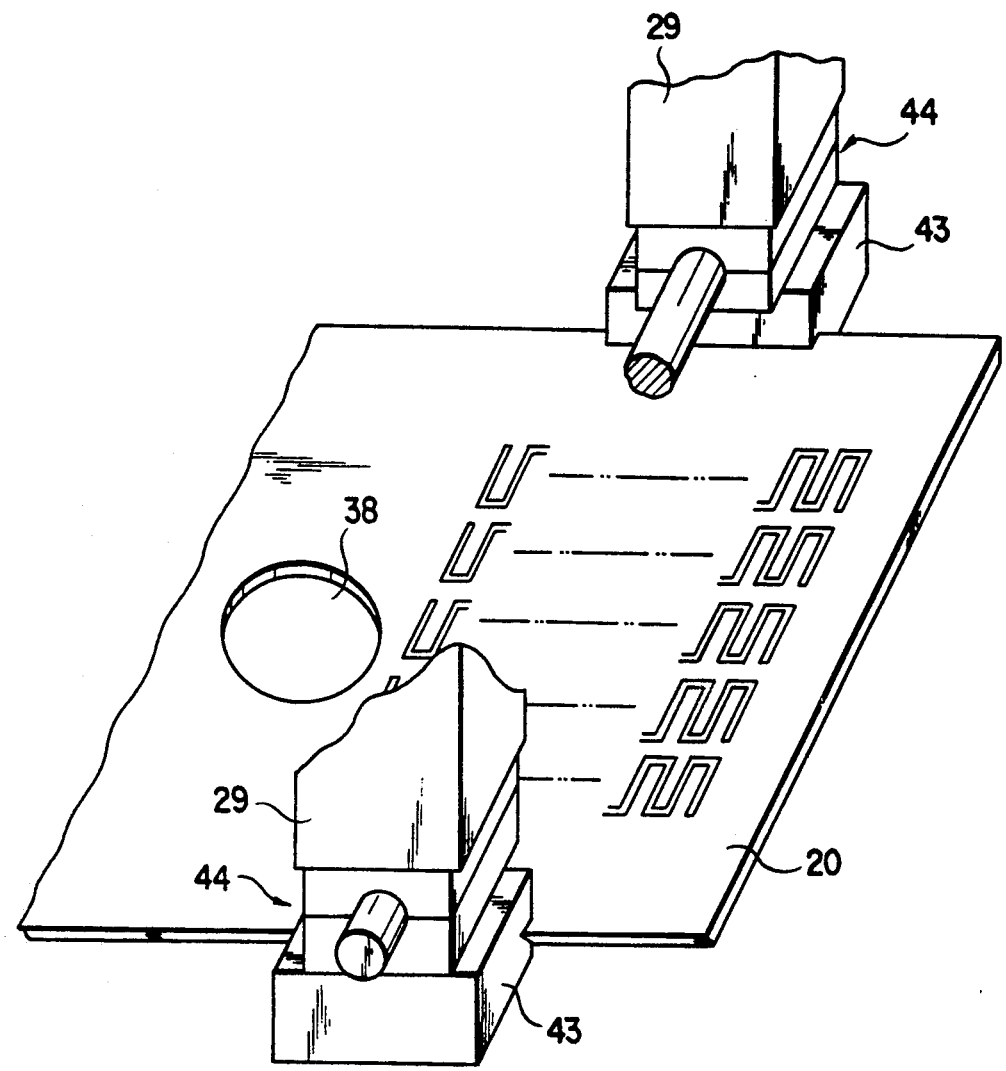
F I G. 3

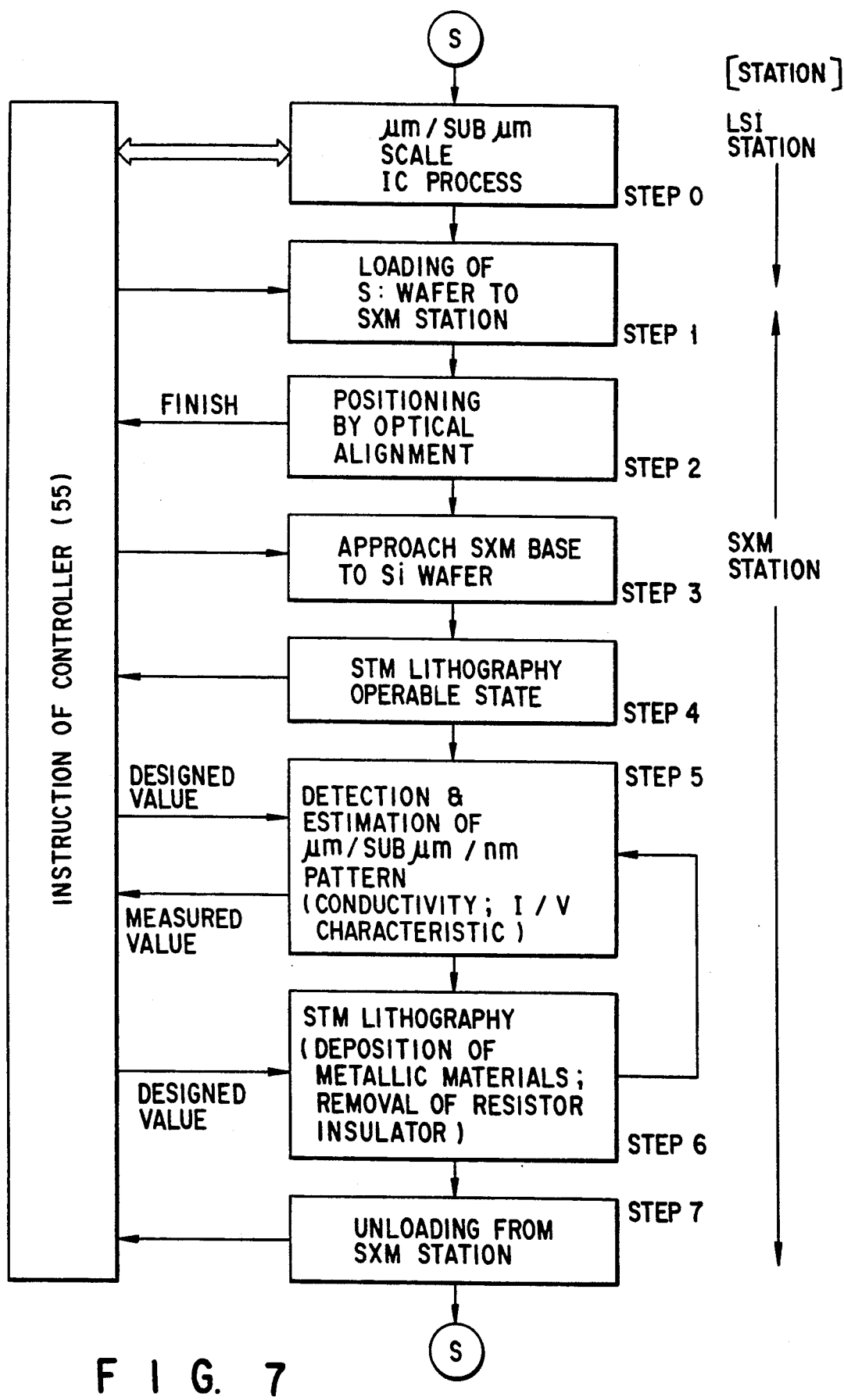
F I G. 7

LITHOGRAPHY APPARATUS USING SCANNING TUNNELING MICROSCOPY

BACKGROUND OF THE INVENTION

1. Field of the Invention

This invention relates to a semiconductor manufacturing apparatus for forming various elements on a semiconductor substrate, and in particular to a lithography apparatus for forming a desired thin film pattern on a semiconductor substrate.

2. Description of the Related Art

In recent years, integration has been developed in a semiconductor device having various functioning elements formed on its semiconductor substrate made of Si or GaAs, and now LSIs (Large Scale Integrated circuits) and VLSIs (Very Large Scale Integrated circuits) are prevailing in the market. In particular, one-chip computers are used in various apparatuses such as super computers, electronic calculators, industrial robots, domestic electrical devices, etc. In addition, higher integration is being developed so as to provide ULSIs (Ultra Large Scale Integrated circuits).

Such integrated circuits as above are produced by subjecting wafers to various treatments such as thin film and resist film-forming treatments, exposure-to-light treatment, etching and doping treatments, etc. Many improvements have been made to the wafer treatment techniques so as to form highly integrated circuits on the wafer.

In the wafer processing, a photo-lithography technique is often utilized. In lithography, light of a short wavelength and of a monochromatic spectrum is used so as to prevent a reduction in resolution due to diffraction of light, thereby performing submicron-scale lithography. Further, there is a challenge to perform nanometer-scale lithography using a soft X-ray source. Moreover, though it is not suitable for mass production, there is a technique of directly drawing a fine pattern by using an electron beam having a diameter of several tens of nanometers.

In photo-lithography, a resist layer formed on a substrate is exposed to light with a contracted photomask pattern projected onto the resist layer. The wavelength $\lambda$, the focal depth Z, and the resolution R of a light source have the following relationship:

$$Z = \lambda/(NA)^2$$

$$R = k \times NA/\lambda$$

where NA represents the numerical aperture of a contracting lens, and k a certain constant. If the resolution is increased by shortening the wavelength, the focal depth will be small. Accordingly, a desired resolution cannot be obtained when the region to be exposed has an uneven surface. Thus, the region must have a highly even surface. This can be achieved by using a thin film-forming technique. However, the technique requires control of high accuracy, and it would be difficult to apply the technique to production of VSLIs which includes as many as ten or more processes.

Moreover, in accordance with the development of refining techniques of patterns, high accuracy has been required also in alignment of upper and lower patterns formed repeatedly, which makes a detection device control system complex, resulting in a difficulty in performing auto alignment of a photomask pattern.

Furthermore, in lithography using electron beams, in accordance with refining of the diameter of an electron beam, electromagnetic lenses and their peripheral apparatuses have been enlarged. Thus a complex technique has been required to hold a substrate in a vacuum atmosphere, and further it has been difficult to perform etching.

Since an apparatus of a large size has low characteristic frequency, a three-dimentional relative static performance between a substrate and a mask of a light source or of a contracting optical system is deteriorated. As a result, a large vibration eliminator is required so as to avoid influence of vibration occurring outside, and an additional device for controlling distortion in the apparatus due to temperature and ambient pressure is required.

Thus, in photo-lithography using soft X rays or in lithography using electron beams, submicron scale lithography is now approaching its limit.

Incidently, STM lithography using a scanning tunneling microscope (STM) has been proposed these days, and is expected much by those skilled in the art. In the STM lithography, atoms or molecules are adsorbed onto or removed from a substrate with resolving power determined by the shape of the tip of a probe. In an ideal state, only one atom can be adsorbed onto or removed from the substrate. This technique is summarized in "The scanning tunneling microscope as a tool for nanofabrication, Nanotechnology 1 (1990) 67–80" written by G. M. Shedd et al.

In the technique, when a voltage is applied between a probe and a semiconductor wafer, a tunneling current or a field-emitted current will flow therebetween. The tunneling current is caught as an electron beam having a diameter determined by the shape of the probe tip. The diameter can be reduced to as small as 1 nm in a most desirable state. By supplying a gas consisting of atoms or molecules onto the substrate, and simultaneously applying the tunneling current (electron beam) between the probe and the substrate, the atoms or molecules can be adsorbed onto only that portion of a substrate on which the tunneling current flows. That is, a desired amount of atoms or molecules can be deposited on the semiconductor wafer, with the resolving power of the electron beam as determined by the diameter thereof. Further, molecules or atoms constituting a thin film formed on a substrate can be removed by varying the above conditions. Also in this case, removal is performed only in a portion on which the tunneling current (electron beam) flows, so that the thin film is etched with the resolving power of the beam as determined by the diameter thereof. Thus, an ultra fine thin film pattern is formed which cannot be obtained by using photo-lithgraphy.

In addition to its primary operation for obtaining a three-dimentional image indicative of the unevenness of the surface of a conductive substance, STM lithography can discriminate whether or not a substance is a metal or a semiconductor by measuring the I/V characteristic between a voltage, applied between the probe and substance, and a tunneling current flowing therebetween. Moreover, there is an atomic force microscope (AFM) which is similar to the STM and which can detect the unevenness of the surface of an insulating substance. With an AFM, instead of detection of tunneling current, that displacement in an elastic body is detected which is caused by an interatomic force exerted between a probe and a sample when the probe is approached to a point 10–0.1 nm before the sample, thereby obtaining an atom-scale three-dimensional image indicative of the unevenness of the sample surface as with an STM. Since the AFM can detect the unevenness of the surface of the insulating substance, it also can measure the isolation structure of elements in a semiconductor circuit, and the pattern of a capacitor element in the same.

In a case where STMed LSI chips are manufactured in an independent system by using STM lithography, it is required to develop a new system employing a technique higher than a submicron-scale lithography apparatus since at present there are no techniques of interfacing a nanometer-scale input/output pattern, in order, for example, to perform wire bonding or surface bonding between one STMed chip and a lead frame or a submicron-scale VLSI chip.

SUMMARY OF THE INVENTION

It is an object of the invention to provide a lithography apparatus capable of forming, by means of STM lithography, very fine thin film which cannot be obtained by photo-lithography.

If the above-described technique is utilized, a pattern can be connected to a conventional micron or submicron-scale IC pattern (e.g. MOS circuit) on a semiconductor wafer by using STM lithography. In this case, if the IC pattern to which a pattern is to be connected by using STM lithography is an input/output portion or contact hole of a conventional IC circuit, a tunnel current is detected using a probe as STM estimation probe, thereby detecting the locations of the input/output portion or contact hole, and then connecting a pattern to them by using STM lithography. Further, if the IC pattern is a capacitantive element pattern made of a SiO, $SiO_2$ or $Si_3N_4$ insulation film, the locations of the input/output portion or contact hole are detected by using the probe as AFM estimation probe if necessary, then trimming (i.e., eliminating molecules or atoms by STM) or deposition of the pattern is performed. In addition, an LSI circuit estimation step may be provided after the lithography steps which include the STM lithography step in order to estimate the LSI chip produced by the completion of the lithography step. In the LSI circuit estimation step, the probe used in the STM lithography step is used as an STM estimation probe to estimate conductivity and semiconductor characteristics of the circuit pattern of the LSI chip, and is used as an AFM estimation probe to estimate three dimensional surface configuration, isolation film pattern and electron trapped condition. As is described above, the lithography system of the invention proves interface means (including estimation means) between a nanometer-scale circuit by the STM lithography and a micron/submicron-scale LSI circuit, such that a new lithography technique including both the conventional LSI technology and the STM lithography technology is realized.

It is another object of the invention to provide a lithography apparatus incorporating a system for interfacing an "STMed LSI", formed by STM lithography, with an LSI circuit located under the STMed LSI such that they can easily cooperate with each other.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a view, showing an SXM station employed in a lithography apparatus of the invention and associated with STM lithography;

FIG. 2 is a plan view, showing a silicon wafer and an SXM base;

FIG. 3 is a perspective view, showing the SXM base and its supporting portion;

FIG. 7 is a flowchart, useful in explaining operation of the SXM station.

DETAILED DESCRIPTION OF THE PREFERRED EMBODIMENTS

Figure 4:
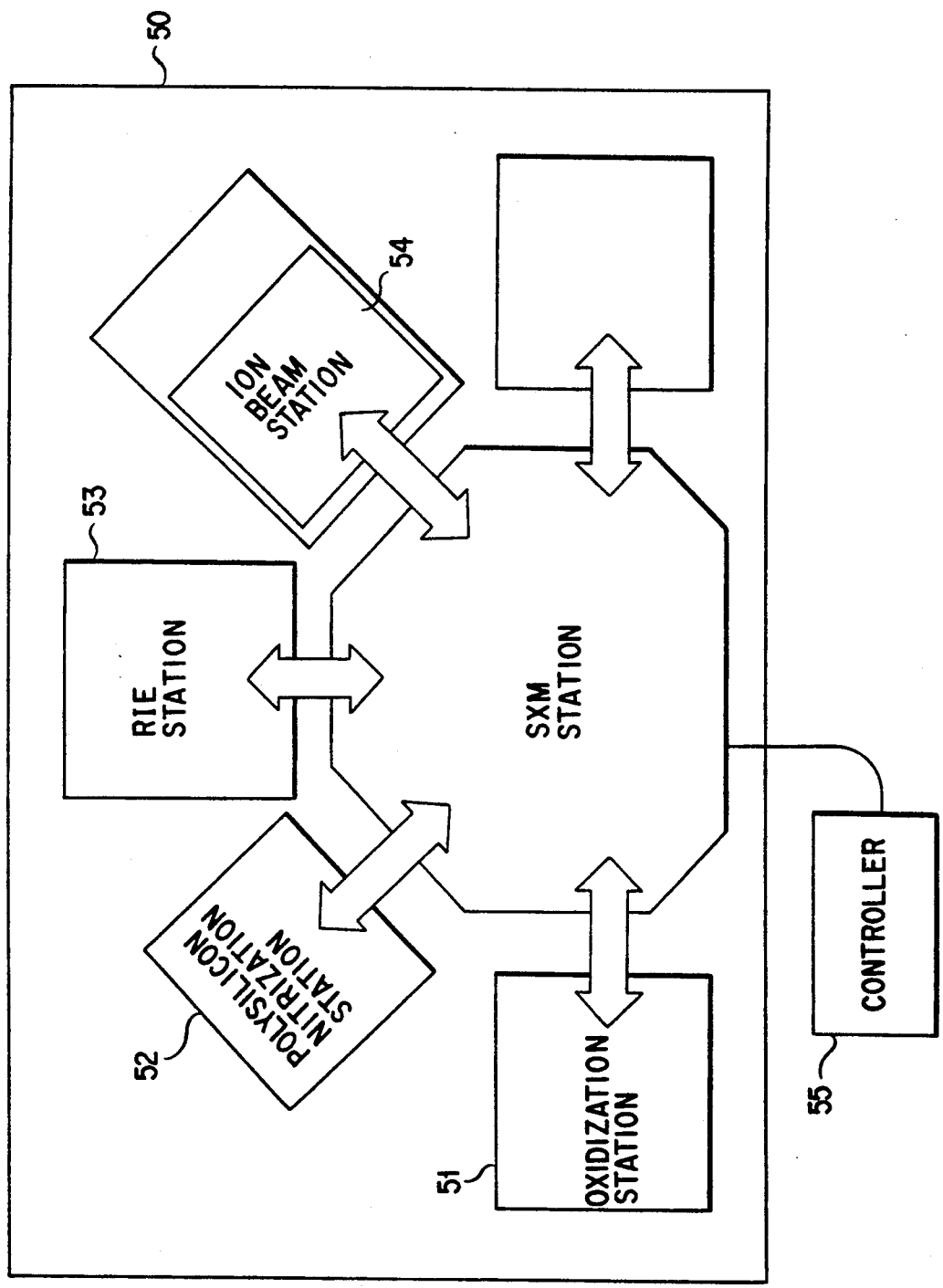
FIG. 4 is a view, showing the overall arrangement of the lithography apparatus of the invention.

The lithography apparatus of the invention will be explained with reference to the accompanying drawings showing an embodiment thereof.

FIG. 1 shows an SXM station employed in a lithography apparatus of the invention and associated with STM lithography. The station has a wafer stage 30 on which a silicon wafer 6 to be processed is mounted. An SXM base 20 is located above the stage 30, and is secured to a mirror base 19 by means of a supporting arm 29 via inchworm devices 43 and 44, such that it faces the silicon wafer 6. The base 20, hereinafter referred to, is a base plate having a plurality of probes and cantilevers supporting the probes, respectively. In the specification, the word SXM is used as the generic term of a series of techniques derived from the STM.

The SXM station is provided with a optical system for aligning the silicon wafer with the SXM base 20. Here, the optical system will be explained. Parallel rays emitted from a light source 40 are reflected by a half mirror 41, then passes through a half mirror 25, and then reaches a half mirror 23. The half mirror 23 transmits part of the parallel rays therethrough, and reflects the other part of the same. The rays transmitted through the mirror 23 are converged onto the silicon wafer 6 by means of an objective lens 21, then reflected from the wafer 6, become parallel rays again by the lens 21, return to the mirror 23, and pass therethrough. On the other hand, the rays reflected on the mirror 23 are reflected again by a mirror 24, and thereafter converged onto the SXM base 20 by an objective lens 22. The converged rays are reflected therefrom, are made parallel again by the lens 22, are reflected by the mirror 24, reach the half mirror 23, and are reflected therefrom. Accordingly, the rays reflected from the wafer 6 and those reflected from the SXM base 20 are synthesized. The synthesized rays pass through the half mirrors 25 and 41, and then are converged onto a CCD camera 27 by means of an image forming lens 26. As a result, two patterns, beforehand provided on the silicon wafer 6 and SXM base 20 for optical alignment of the wafer and base, are simultaneously formed on the CCD camera 27. The position of the mirror base 19 is adjusted in the vertical direction by means of a driving device (not shown) such that the focal point of the lens 21 could be positioned on the wafer 6. The position of the SXM base 20 is adjusted in the vertical direction by the support arm 29 such that the focal point of the lens 22 is positioned on the base, and is kept as it is after the adjustment. The SXM base 20 is adjusted before the mirror base 19 is adjusted. These adjustments are performed in response to the output signal of a focus-adjustment detector 28 which receives part of rays reflected from the half mirror 25 when they pass the same.

The silicon wafer 6 will be explained with reference to FIG. 2. Substantially complete circuit elements are beforehand formed on the silicon wafer 6 by the conventional LSI process. Thus, the wafer 6 has an alignment pattern SP, which was used in the prior process, formed thereon. In the circuit formed by the conventional patterning, contact points (c), which occupy contact holes to extend through a conductive layer, a semiconductor p+ layer and a semiconductor n+ layer and vertically connect the conductive layers, and electrode patterns used as terminals are present on the surface at 2-10 μm pitch. The contact holes and the electrode patterns are aligned with the alignment pattern with highest accuracy.

Then, the SXM base 20 will be explained with reference to FIGS. 2 and 3. Alignment patterns (BP) similar to the alignment pattern (SP) of the wafer 6 are formed on the base 20. The base 20 also has an aperture 38 formed therein for optically observing the wafer 6, as well as a probe unit for performing STM, AFM, etc., which is arranged to accord with the alignment patterns (BP) so as to correspond to pitches designed on the surface of the wafer 6. The probe unit has a cantilever having a length of 1-2 mm, a width of 10-100 μm, and a thickness of 1-5 μm, and two-dimentionally movable right and left and in the vertical direction. The cantilever has a free end provided with a sharp probe made of a conductive material for performing STM operation, and has a wire formed therein to conduct a tunneling current to a detection circuit. The cantilever is made of an Al electrode film and a ZnO film, and forms a piezoelectric driver having two bimorphs, which extend parallel with each other in the longitudinal direction of the cantilever, with the probe interposed therebetween. The cantilever is controlled to scan right and left, by varying a driving voltage supplied from the outside, and the distance between the tip of the probe and the silicon wafer is adjusted by moving the probe in the vertical direction. The probes of the probe unit are controlled independently from each other by a probe control system. The SXM base 20 can be roughly moved in the X and Y directions (FIG. 1) by an XY movement device 42 (FIG. 1), together with the mirror base 19, accurately moved in the X direction by the X inchworm device 43 supporting both parallel ends of the base 20, and accurately moved in the Y direction by the Y inchworm device 44 supporting the X inchworm device 43.

FIG. 4 shows the overall structure of the lithography apparatus of the invention. The SXM station is accommodated in a chamber 50, together with an oxidization station 51, a polysilicon/nitridation station 52, a RIE (Reactive Ion Etching) station 53, an ion beam station 54, etc., in which the conventional independent semiconductor treatments are performed. The silicon wafer 6 is moved by a known auto loader from one station to another. The stations and the wafer movement are controlled by a controller 55.

The operation of the SXM station will be described referring to the flowchart of FIG. 7.

First, the silicon wafer 6 is transferred to the wafer stage 30 by a loader (not shown) in step 1, after being subjected to a treatment in step 0 for forming semiconductor circuit elements. The wafer 6 on the stage 30 is rotated by a driver 34 located under the stage 30, and the orientation flat of the wafer 6 is checked by an orientation detector 35 during the rotation. The wafer 6 is stopped when it faces to a predetermined direction, thereby determining the orientation thereof. Then, the mirror base 19 supporting the SXM base 20 is moved in the vertical direction, and at the same time the focus-adjustment detector 28 is operated, so that the optical image of the wafer 6 could be monitored by the CCD camera 27. This operation is performed while the wafer 6 is being transferred to the SXM station 50 by the loader. At this time, the mirror base 19 is retreated upward so as to prevent the wafer 6 from contacting the SXM base 20, and so as to treat silicon wafers of different thicknesses.

Subsequently, the SXM base 20 is moved by the XY moving device 42 in the X and Y directions parallel to the surface of the wafer 6. At this time, the wafer 6 is in a focus-adjusted position, and hence the surface pattern of the wafer is monitored by the CCD camera 27. The wafer 6 is moved by a sliding mechanism in the X and Y directions at high speed while it is kept in a focus-adjusted state. This movement is controlled by the controller 55 based on designed data of the semiconductor circuit elements on the wafer 6. Specifically, the wafer 6 is moved in response to the output of the CCD camera in which pattern matching is performed, so that the alignment pattern SP 11 shown in FIG. 2 would be aligned with the alignment pattern BP21 (step 2). It is considered that the deviation between the alignment patterns can be restrained within a range of 0.1 μm or less. If the SXM base 20 overruns due to inertia caused at the time of alignment of the patterns, its position is controlled by the X inchworm device 43 and Y inchworm device 44 in the X and Y directions, respectively. This control can be performed with high resolution by virtue of the inchworm mechanism which can move the base 20 in units of 1-0.1 nm.

After the wafer 6 and SXM base 20 are positioned by aligning the alignment patterns, the support arm 29 is moved from the initial set position, thereby moving the SXM base 20 toward the wafer 6 (step 3). Probes located at the four corners of the base 20 are controlled by the controller 55 to monitor the tunneling current. When these probes detect the tunneling current, the support arm 29 and hence the base 20 are stopped. Thus, the base 20 is set in a state in which the STM can be performed (step 4).

Thereafter, the probes are operated to perform scan to detect and estimate the pattern of the wafer (step 5), and then another pattern is formed on the wafer by STM lithography (step 6). If necessary, the STM lithography is repeatedly performed. Accordingly, the submicron-scale semiconductor circuit elements are interfaced with the circuit made by the STM lithography. Finally, the wafer 6 is unloaded from the SXM station 50. If necessary, total estimation and supplying estimation of the circuit may be performed with the STM/AFM probe, before the wafer is unloaded.

Figure 5:
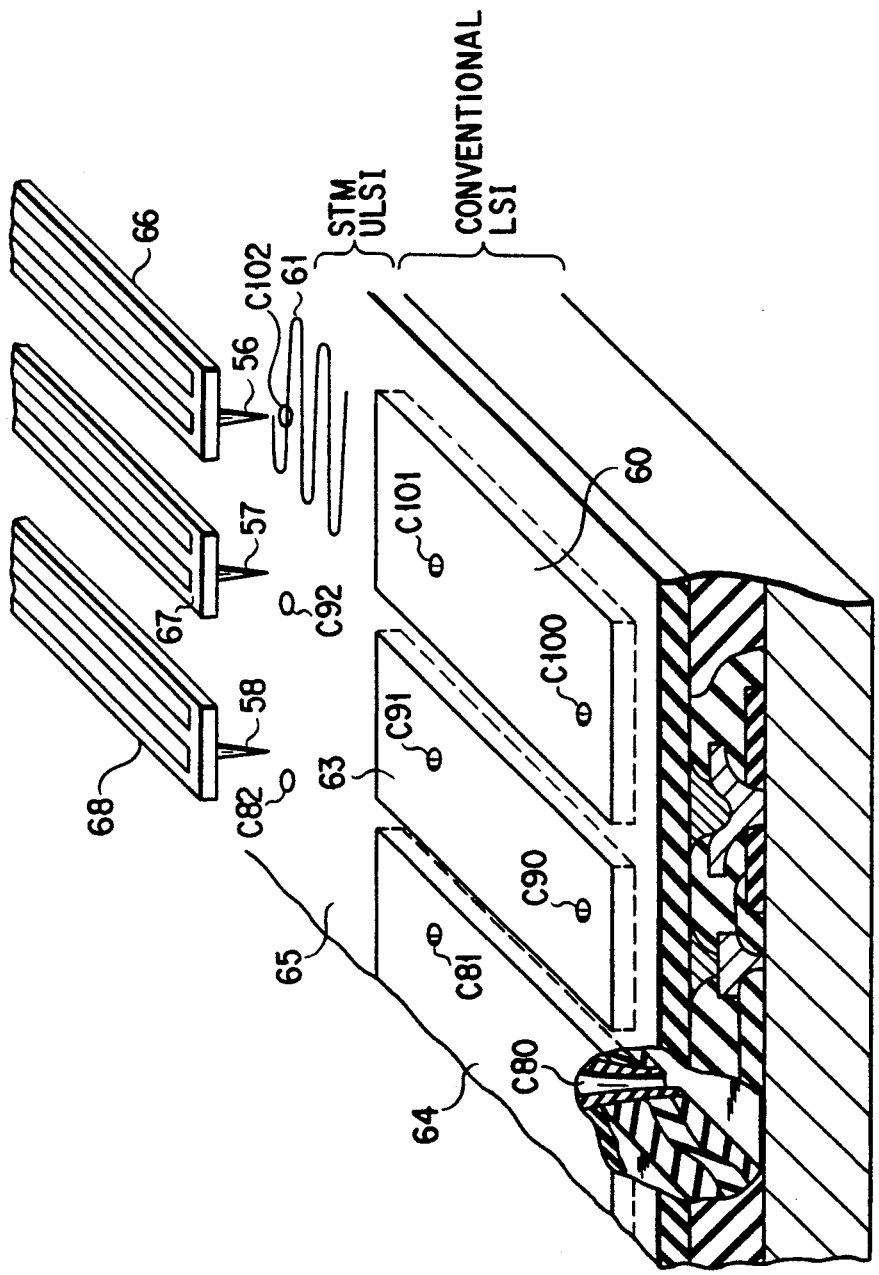
FIG. 5 is a view, useful in explaining scan of a probe made along the silicon wafer surface so as to detect a contact hole.

Then, the STM lithography will be explained in detail with reference to FIGS. 2 and 5. In FIG. 2, when the alignment pattern SP11 is aligned with the alignment pattern BP21, a cantilever group T50 (8×4=32 cantilevers) of all the cantilevers having a plurality of probes and provided on the SXM base 20 is positioned on a left-upper portion of an LSI region L50 of all the LSI regions (L1, ..., L50, ..., L100, ..., L200, ... ) of the wafer 6. Further, as is shown in FIG. 5 depicting part of the region L50, probes 56–58 are operated to scan the contact holes C formed in a circuit element 61 incorporated in each LSI.

The scan is performed using a 2 $\mu$m-amplitude X scan by cantilevers 66–68 serving as bimorph piezoelectric drivers, and also by a Y scan by the Y inchworm device 44. When the probes 56–58 reach contact holes C102, C92, and C82, a tunneling current flows and is detected. 8 probes are controlled by the controller to detect parallel contact holes. In the circuit elements 60, 63, and 64, after contact holes C100, C90, and C80 are detected using the cantilevers 66–68, voltage is applied to the probes at predetermined points of time while WSi gas is being supplied from gas supplying source 36, thereby depositing the gas on predetermined portions of the wafer, and performing wiring of a conductive pattern (not shown) using the contact holes C100, C90, and C80 as input terminals or using the contact holes C101, C91, and C81 as output terminals. If a wiring pattern of 20 nm line width is formed using the probes by means of the STM lithography, (50×125) X and Y lines can be drawn in a 2 $\mu$m×5 $\mu$m area in consideration of isolation portions of the same width as the line.

In the estimation step (Step 5), in which the probe at the free end of the cantilever is scanned over the LSI circuit, tunnel current is not detected when the probe is at above the isolation region. At this movement, therefore, a displacement detector (not shown) is used to detect the displacement in the cantilever, which represents the interatomic force exerted between the probe and wafer surface, to keep the distance between the probe and silicon wafer to approx. 1 nm on the basis of a signal supplied from the displacement detector. The above operation is called as AFM operation. While the above AFM operation is being performed, electron distribution and capacitance may be measured by applying alternating voltage between the probe and conductive layer which are in face to face with each other across isolation layer, and detecting alternating current. Also, the probe is used not only for detection of the tunneling current in a conductive region, but also for examination of semiconductor characteristics (i.e. I/V characteristic) by STS (Scanning Tunneling Spectroscopy) operation modulating the voltage applied to the probe.

The controller can cause the probes, provided on the SXM base, to measure characteristics of a grounding circuit or power supply circuit formed on the wafer 6, particularly to measure, in inline processing, characteristics of junction as an element or static and dynamic characteristics such as a resistance value and a capacitance value, and also to perform STP (scanning tunneling potentiometry) measurement as an STM spectroscopic technique, which estimate voltage distribution between two points on a semiconductor layer. These estimation data is used, if necessary, to correct the steps to be performed after on the basis of the controller 55.

When the alignment patterns SP11 and BP2 are aligned with each other, another cantilever group T60 is aligned with a left upper portion of an LSI region L60 of the wafer 6. If the SXM base 20 is moved in the Y direction (by a value a little less than the radius of the wafer 6), and the alignment pattern SP11 is aligned with an alignment pattern BP22, the cantilever group T50 will be aligned with a left upper portion of an LSI region L70. The alignment pattern SP11 can be located in a desired portion of the wafer 6, and any one of the cantilever groups of the SXM base can be programmably aligned with the pattern SP11. Further, in wiring deposition in the cantilever groups, the distance between each probe and the wafer 6 can be adjusted by the bimorph control made independently to each cantilever, thereby controlling the forming of various wiring patterns independently from the other steps performed parallel therewith. Accordingly, ID data such as a security code can be incorporated in a semiconductor element.

Each contact hole shown in FIG. 5 is an input/output terminal of an LSI circuit incorporated in the wafer 6 by micron-scale lithography, and is a point from which STM lithography is started, i.e., is the origin of a circuit element drawn by the STM lithography. Thus, after a wiring pattern or gate electrode pattern is formed in the first STM lithography step, silicon epitaxial p+ and/or n+ layer are formed by the conventional submicron-scale photolitho-mask work. At this time, the contact hole from which the STM lithography is to be started is protected with a submicron-scale photolitho-mask, and is again used as the starting point in the second STM lithography step, thereby performing nanometer-scale-alignment with the pattern formed in the first STM lithography step. In place of forming of the contact hole, an alignment pattern may be newly formed in the first STM lithography step so that it could be set as the origin. In the second STM lithography step, the thin film pattern formed in the conventional thin film-forming process (Step 0) is etched, thereby forming a nanometer-scale thin film pattern. In the next step, i.e., in the next conventional thin film forming step or in the third STM lithography step, a wiring pattern and an electrode pattern are formed by again referring to the origin.

Figure 6A:
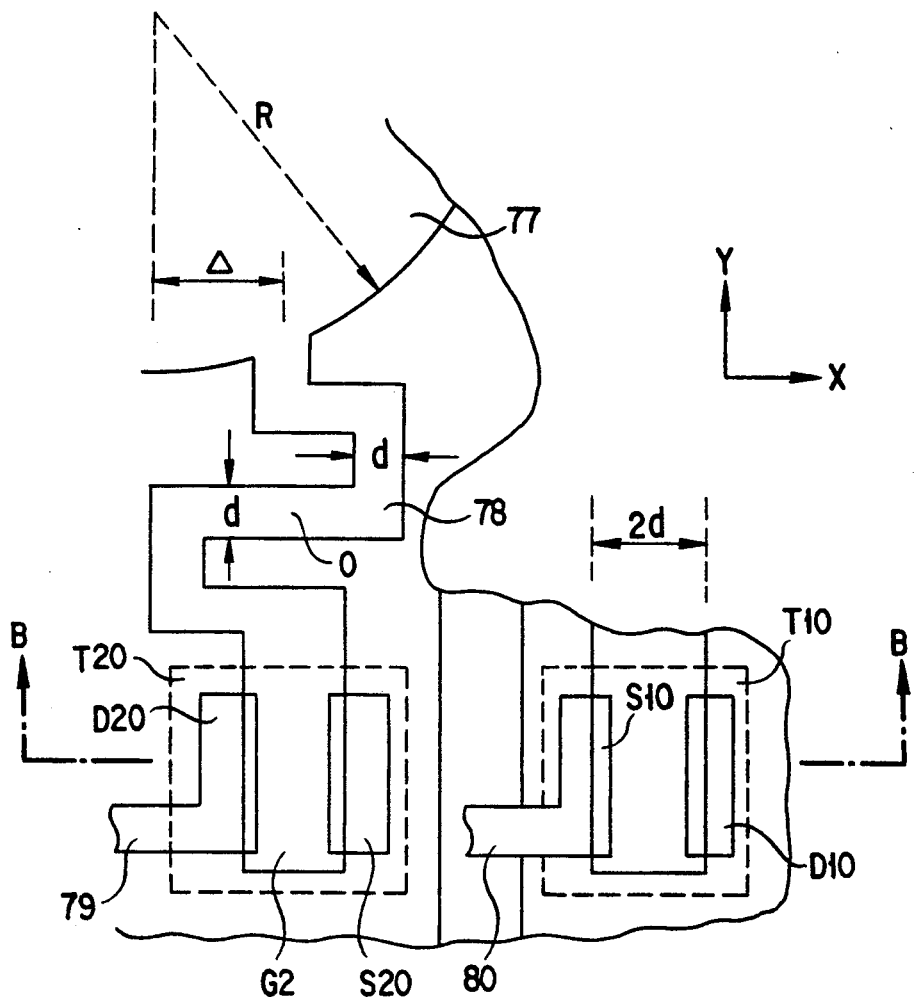
FIG. 6A is a plan view, showing elements made by STM lithography.
Figure 6B:
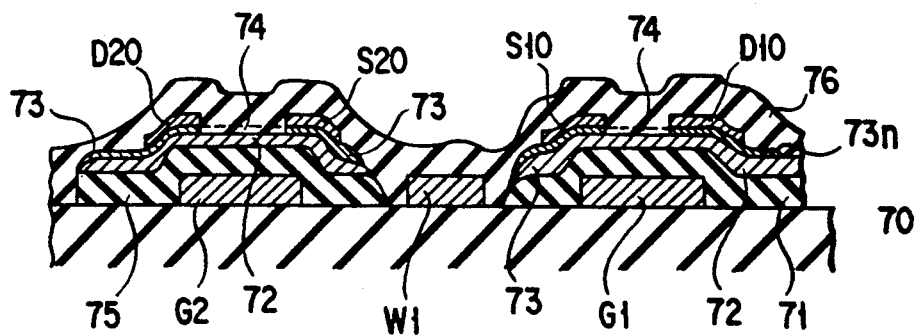
FIG. 6B is a sectional view, taken along line B - B in FIG. 6A.

An example of the above-described method will be explained with reference to FIGS. 6A and 6B. First, the probe detects a contact hole 77 in response to the instruction of the controller 55. The hole 77 is shown as a circle having a radius R. The center of the hole is, however, biased from a design value by $\Delta$ in the X direction. In the first STM lithography step, a starting pattern 78, from which the second STM lithography is to be started, is drawn by tungsten (W) wiring, thereafter a gate electrode G2 of a memory film transistor T20 is formed, and subsequently a wiring layer W1 and a gate electrode G1 of a film transistor T10 are formed.

Subsequently, the silicon wafer is unloaded, and then subjected to a conventional LSI-forming process, where first a gate insulation film 75 or a memory gate insulation film 71 is formed by a nitride silicon film-forming step. The nitride silicon film of the film transistor T10 has a stoichiometric ratio Si/N of 0.75, and that of the film transistor T20 a stoichiometric ratio Si/N of 0.85–1.15. The transistor T20 has a charge-accumulation function. Then, an i-type semiconductor layer 72 and an n-type semiconductor layer 73 are patterned on the resultant structure. The n-type semiconductor layer 73 is formed integral with an n-type semiconductor layer 74 by photo-lithography or X-ray lithography.

Subsequently, the wafer 6 is returned onto the SXM station, where the second STM lithography is performed. At this time, the probe detects the starting pattern 78 formed by the first STM lithography, and performs nanometer-scale alignment.

Thereafter, the n-type semiconductor layer 74 constituting part of the n-type semiconductor layer 73 is subjected to STM etching over a width of 20–50 nm thereof, thereby separating the pattern. The second STM lithography may include STS operation step to measure whether or not the i-type semiconductor layer 72 has been exposed.

In the next third STM lithography, the starting point is reconfirmed. Then, source electrodes S20 and S10 or drain electrodes D20 and D10 are deposited, and wiring of a transistor structure is formed, thereby drawing a coupling line 79 connecting the drain electrode G2 and gate electrode D20 or a coupling line 80 connecting the source electrode S10 and gate electrode G1. Thereafter, the wafer is subjected to a conventional LSI step where a protection film 76 of a silicon nitride or the like is formed.

The width d of a line formed by the STM lithography is determined to be within the range of 10 to 50 nm in accordance with the wiring pattern, electrode pattern, etc. which are dependent on a combination of semiconductor-fabricating processes. In the STM lithography, a positioning error is within 1 nm or so.

The apparatus of the invention is applicable also to a semiconductor substrate made of AlGaAs, InGaAs, or InP. Further, after an epitaxial layer consisting of Al, GaAs, or In, or of mixture of them is formed on a silicon substrate, STM lithography etching is performed, thereby directly forming a fine lattice structure of nanometer-scale width and pitch wiring. Alternatively, the fine lattice structure can be made in an indirect manner by subjecting a wafer obtained after a film-forming step using the CVD method, to STM lithography trimming. In a highly integrated GaAs or silicon circuit, the degree of delay in the speed of signal transmission is determined by the wiring of the circuit, and it is considered that the finer the highly-densed wiring, the greater the resistance thereof, so that the capacitance thereof can be prevented from being greatly reduced. The STM lithography wiring can be effectively made if a mixture of Au or Ag and a silicate or an arsenide is used as the material of the wiring.

A quantum structure active layer or a clad layer whose light-transmission speed is controlled is formed by selecting a mixture ratio of Al, Ga, As, P, or In, thereby providing a laser structure. The above-described fine lattice structure can control the wavelength of laser, provide a filter separating signal systems from one another, and perform high speed parallel signal processing in a single system.

In the embodiment, the input/output terminal formed on the silicon wafer by submicron-scale lithography does not necessarily comprise a contact hole, but may comprise a conductive film formed on a predetermined portion of the surface of the LSI circuit. Further, where a three-dimentional structural circuit is formed by laminating electrode films on a semiconductor film provided at a predetermined location, it is a matter of course that the electrode films can be directly formed by STM lithography under the control of the controller since patterns formed in successive steps can be accurately aligned with one another.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A lithography apparatus for forming a pattern on a semi-finished wafer which has both a wafer alignment pattern and an IC pattern thereon, said lithography apparatus comprising:

a wafer stage for holding the wafer;

an SXM base having a plurality of cantilevers, each cantilever having a pointed probe at a free end thereof and each probe being movable at least in a two-dimensional direction, and said SXM base further having a reference alignment pattern for aligning itself with the wafer;

alignment means for aligning the wafer and the SXM base with each other by optically detecting the wafer alignment pattern and the reference alignment pattern;

means for moving the SXM base relative to the wafer stage in a three-dimensional directional; and pattern-forming means for causing the probes to form a fine pattern on the wafer.

2. The lithography apparatus according to claim 1, wherein the alignment means comprises:

a light source;

means for dividing a ligh beam emitted from the light sources into two beams;

means for emitting one of the beams to the wafer alignment pattern;

means for emitting the other of the beams to the reference alignment pattern;

means for forming an image from beams reflected from the wafer alignment pattern and the reference alignment pattern, respectively; and means for comparing the position of the image of the wafer alignment pattern with that of the image of the reference alignment pattern.

3. The lithography apparatus according to claim 1, wherein the pattern-forming means comprises means for applying a voltage to the STM probe at a predetermined point of time.

4. The lithography apparatus according to claim 3, wherein the pattern-forming means further comprises means for supplying the wafer with a gas containing a pattern-forming material.

5. The lithography apparatus of claim 1, further comprising controller means for controlling said evaluating means and said pattern-forming means to cause the probes to stop movement at predetermined timings and apply a voltage in synchronism with said predetermined timings, so as to thereby effect one of forming and evaluating a local circuit pattern at positions where the probes stop.

6. The lithography apparatus according to claim 1, further comprising means for conveying the wafer between the lithography apparatus and a semiconductor station for executing a semiconductor device fabrication process, without using probes.

7. The lithography apparatus according to claim 1, further comprising evaluating means for evaluating a pattern formed on the wafer.

8. The lithography apparatus according to claim 7, wherein said evaluating means comprises:
 means for producing a potential difference between the probes and the wafer; and
 means for detecting a tunnel current flowing between the probes and the wafer.

9. The lithography apparatus of claim 1, further comprising parallelism-maintaining means for maintaining the wafer and the SXM base in parallel to each other.

10. The lithography apparatus according to claim 9, wherein said parallelism-maintaining means comprises means for monitoring a tunnel current flowing through those probes which are located at a peripheral portion of the SXM base.

11. A lithography method comprising:
 a photolithography step of optically forming a fine pattern on a wafer; and
 an SXM lithography step of modifying the fine pattern formed in said photolithography step by forming a further fine pattern on the wafer using a pointed probe held by an SXM base.

12. The lithography method according to claim 11, further comprising an evaluation step of evaluating the fine patterns formed on the wafer in at least one of the photolithography step and the SXM lithography step.

13. The lithography method according to claim 11, further comprising an optical alignment step of optically detecting two alignment patterns respectively formed on the wafer and the SXM base, and aligning the two alignment patterns with each other such that the wafer and the SXM base are aligned with each other.

14. The lithography method according to claim 13, further comprising an optical detection step of detecting a predetermined portion of the fine pattern formed in the photolithography step using the probe of the SXM base, to investigate a precise positional relationship between the SXM base and the wafer.

15. The lithography method according to claim 14, wherein said predetermined portion is a contact hole in the fine pattern formed on the wafer in a photolithography step.

16. The lithography method the claim 14, wherein said predetermined portion is an input/output electrode pattern formed in the fine pattern formed on the wafer in the photolithography step.

* * * * *